United States Patent
Ammon et al.

(10) Patent No.: US 6,228,164 B1
(45) Date of Patent: May 8, 2001

(54) PROCESS FOR PRODUCING A SINGLE CRYSTAL

(75) Inventors: Wilfried von Ammon, Hochburg/Ach (AT); Rüdiger Schmolke; Dieter Gräf, both of Burghausen (DE); Ulrich Lambert, Emmerting (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/318,659

(22) Filed: May 25, 1999

(30) Foreign Application Priority Data

May 28, 1998 (DE) ................................................ 198 23 962

(51) Int. Cl.⁷ .................................................. C30B 29/06
(52) U.S. Cl. .................................. 117/19; 117/13; 117/20
(58) Field of Search ................................... 117/13, 19, 20

(56) References Cited

U.S. PATENT DOCUMENTS

| | | |
|---|---|---|
| 3,880,984 | 4/1975 | Akiyama et al. . |
| 4,591,409 | 5/1986 | Ziem et al. . |
| 5,935,320 * | 8/1999 | Graef et al. .............................. 117/2 |

FOREIGN PATENT DOCUMENTS

| | | |
|---|---|---|
| 0170788 | 2/1986 | (EP) . |
| 0536958 | 4/1993 | (EP) . |
| 0527477 | 1/1996 | (EP) . |
| 0829 559 | 3/1998 | (EP) . |
| 6-271399 | 9/1994 | (JP) . |

OTHER PUBLICATIONS

Ammon von W et al.: "The Dependence of Bulk Defeats on the Axial Temperature Gradient of Silicon Crystals During Czochralski Growth".

Maddalon–Vinante: "Influence of Rapid Thermal Annealing and Internal Gettering on Czochralski–Growth Silicon. I. Oxygen Precipitation", Journal of Applied Physics.

Watanabe: "Controlled Oxygen Doping In Silicon", Intern. Confer. on Solid State Devices & Materials.

Dornberger E et al: "Influence of Boron Concentration on the Oxidation–Induced Stacking Fault Ring in Czochralski–Silicon–Crystals", Journal of Crystal Growth.

Patent Abstracts of Japan, vol. 018. No. 680, Dec. 21, 1994.

Voronkov: "The Mechanism of Swirl Defects Formation in Silicon", Journal of Crystal Growth.

English Patent Abstract Corresponding to EP 0 527 477 B1.
English Patent Abstract Corresponding to EP 0 829 559 A1.
English Abstract Corresponding to JP 6–271399.
English Abstract Corresponding to EP 0 527 477.
Chemical Abstracts, CN 88–100307.
C. Hasenack et al, Proc. 173$^{rd}$ Meeting Electro–chem. Soc, 447 (1988).
W. V. Ammon et al., Proc. of The Satellite Symp. to ESSDERC 93, Grenoble, The Electrochem. Soc.
R.S. Hockett, Appl. Phys. Lett. 48, 1986, p. 224.
"Influence of Oxygen and Nitrogen on Point Defect Aggregation in Silicon Single Crystals," Ammon, W. V, et al; Materials Science & Engineering B(Solid–State Materials for Advanced Technology); (Jan. 1996) vol. 36, No. 1–3, pp 31–41.*

\* cited by examiner

*Primary Examiner*—Felisa Hiteshew
(74) *Attorney, Agent, or Firm*—Collard & Roe, P.C.

(57) ABSTRACT

A process for producing a silicon single crystal has the crystal being pulled using the Czochralski method while being doped with oxygen and nitrogen. The single crystal is doped with oxygen at a concentration of less than $6.5*10^{17}$ atoms $cm^{-3}$ and with nitrogen at a concentration of more than $5*10^{13}$ atoms $cm^{-3}$ while the single crystal is being pulled. Another process is for producing a single crystal from a silicon melt, in which the single crystal is doped with nitrogen and the single crystal is pulled at a rate V, an axial temperature gradient G(r) being set up at the interface of the single crystal and the melt, in which the ratio V/G(r) in the radial direction is at least partially less than $1.3*10^{-3} cm^2 min^{-1} K^{-1}$.

26 Claims, No Drawings

PROCESS FOR PRODUCING A SINGLE CRYSTAL

BACKGROUND OF THE INVENTION

1. Field of the Invention

The present invention relates to a process for producing a silicon single crystal.

2. The Prior Art

As is known, the Czochralski method involves pulling a single crystal from a melt with the aid of a seed crystal, the melt being provided in a crucible. A single crystal obtained in this way (Czochralski=Cz single crystal) should have as few crystal defects as possible (as grown defects). This is because these defects can cause critical problems in the subsequent production of electronic components. The same is also true of a single crystal which is produced using the float zone method (=FZ single crystal). The FZ differs from a Cz single crystal, in part, by a normally substantially lower oxygen content.

It is known that in silicon single crystals, the formation of defects depends, in part, on the pulling rate and the temperature gradient at the interface of the growing single crystal and the melt. If the ratio V/G(r), while the crystal is being pulled, is above a critical constant $c_{crit}$, with $c_{crit}= 1.3*10^{-3} cm^2 min^{-1} K^{-1}$, V being the pulling rate and G(r) the axial temperature gradient at the interface of the single crystal and the melt, excess vacancies are formed. They form during the crystal growth and, when the crystal is cooled, aggregate to form "microholes" or voids (approximately 50–100 nm). Depending on the preparation method with which they are detected, these defects are referred to as D defects, crystal originated particles (COP) or flow pattern (FP) defects.

The higher the density of these defects, the worse is the gate oxide integrity (GOI) in electronic components which are the end products of the subsequent processing of the single crystals. If V/G(r) is below $c_{crit}$, an excess of Si interstitial atoms is formed, which agglomerate to form so-called L pits (Cz crystals) or A swirls (FZ crystals). These Si interstitial aggregations produce, as secondary defects, extended dislocation loops (several μm) which are especially detrimental to component production. Further, L pits reduce the mechanical strength of the silicon, which can be observed by an increased likelihood in terms of slips during the component production process. None of the aforementioned defects are found if the ratio V/G and the constant $c_{crit}$ are equal when the single crystal is being pulled. Since the axial temperature gradient G(r) increases monotonically with increasing radial distance r from the center of the crystal to the edge of the single crystal, there are considerable technical pulling difficulties in setting this latter very desirable condition throughout the crystal volume. In crystals which are pulled approximately under this condition, a region at the center of the crystal with vacancy defects is almost always found. This is followed with radial symmetry by an outer region with L pits (A swirl). In Cz crystals, a narrow strip with oxidation-induced stacking faults (OSFS) is formed at the annular boundary between the two regions. In FZ crystals, an annular denuded zone is found instead of the OSF ring.

In order to avoid the particularly detrimental L pits, all industrially used Cz crystals have to date been pulled with excess vacancies, i.e. V/G(r)>$c_{crit}$ over the entire crystal radius. Attempts have been made to keep the density of the vacancy defects as low as possible. It is known that the oxygen content has only a minor influence on the defect density, and therefore on the GOI quality (C. Hasenack et al., Proc. 173rd Meeting Electrochem. Soc., 447 (1988)).

It has long been known that with FZ crystals, both vacancy and Si interstitial defects can be simultaneously suppressed by a low level of nitrogen doping (approx. $10^{14}$ atoms $cm^{-3}$). This gives an almost perfect GOI quality. This positive effect in terms of the GOI quality is, however, lost when doping with oxygen as well. This is inevitably the case with Cz crystals because of the use of a quartz crucible (W. v. Ammon et al., Proc. of the Satellite Symp. to ESSDERC 93, Grenoble, The Electrochem. Soc., Vol. 93–15, 36 (1993)). In the case of FZ crystals doped with oxygen and nitrogen it is admittedly true that the nitrogen doping can also establish an improvement in the so-called B+ mode failures in electrical stress tests. But this is of no importance since it is only the percentage of capacitors which reach intrinsic failure (C+ mode) which is of interest to component producers. In Cz crystals, the defect densities are at another order of magnitude compared to FZ. (FZ crystals are not comparable with Cz crystals because of the entirely different thermal history, substantially higher purity, more rapid pulling rate and entirely different process control). In Cz crystals, only nitrogen doping methods have to date been reported with the purpose of reducing the vacancy defect density and therefore increasing the GOI quality (JP-06,271, 399 A). In terms of defect reduction/GOI improvement, however, no quantitative indications whatsoever are given.

The doping of Cz crystals with nitrogen accelerates the precipitation of the oxygen in the single crystal (R. S. Hockett, Appl. Phys. Lett. 48, 1986, p. 224). While the pulled single crystal is cooling, the oxygen starts to precipitate at even higher temperatures than otherwise is usual. This leads to larger precipitation seeds, which in turn during an oxidation treatment carried out subsequently on a semiconductor wafer obtained from the single crystal, produce stacking faults on the surface of the semiconductor wafer. Further, the large precipitates do not dissolve fast enough in the near-surface region of the wafer, during the component production process. Thus it becomes difficult to obtain a denuded zone with the depth specified by the component producer.

SUMMARY OF THE INVENTION

It is, therefore, an object of the present invention to provide processes with which silicon semiconductor wafers with the lowest possible defect density and satisfactory GOI can be produced, without having to tolerate the disadvantages presented above.

The present invention relates to a process for producing a silicon single crystal comprising pulling a silicon single crystal using Czochralski method; and doping the silicon single crystal with oxygen at a concentration of less than $6.5*10^{17}$ atoms $cm^{-3}$ and doping the silicon single crystal with nitrogen at a concentration of more than $5*10^{13}$ atoms $cm^{-3}$ while pulling the silicon single crystal.

It has surprisingly been found that this object is achieved when the aforementioned pulling conditions are established. Investigations in conjunction with the invention have shown that the gate oxide integrity on a semiconductor wafer made from a Cz single crystal produced in this way increases significantly when the semiconductor wafer is exposed to conditions which are required for the production of electronic components. For example, it has been observed that the GOI yield (percentage of functional test capacitors following an electrical stress test) increases from <25% to more than 90% based on a process simulation of a 4M DRAM memory. The production process of the 4M DRAM component contains a number of high temperature treatments (>950° C.) prior to the gate oxide production, during which the crystal defects clearly reduced by the conditions according to the invention are repaired.

The improvement in the GOI based on the process simulation is particularly pronounced if, during pulling, the single crystal is for example actively cooled using a water-cooled heat shield surrounding it. Also, the single crystal is pulled as fast as possible, with the higher nitrogen content being provided and the lower oxygen content being provided. In the case of component processes without high temperature steps, the gate oxide quality must be improved further by an additional rapid thermal anneal step with a temperature in excess of 1150° C.

It has also been found that due to the low oxygen content, the nitrogen-induced OSF formation is greatly suppressed. For example, with an oxygen content of $6*10^{17}$ atoms $cm^{-3}$, the still heavily pronounced OSF ring at $5*10^{17}$ atoms $cm^{-3}$ was no longer observed.

In terms of the oxygen precipitation, it was established that at oxygen contents of below $6.5*10^{17}$ atoms $cm^{-3}$, nitrogen doping has an advantageous effect since, below this concentration, clearly only nitrogen-induced oxygen precipitation is possible. Nitrogen incorporated in a radially uniform manner consequently also leads to radially uniform precipitation of the oxygen. This is no longer dependent on the radial distribution of the vacancies and the Si interstitial atoms. Above all, however, a further result of the nitrogen-induced oxygen precipitation is to ensure sufficient gettering of the silicon material, which would otherwise be compromised with such low oxygen contents. In this case, the oxygen precipitation can to a certain extent be rendered uniform in the axial direction if an oxygen content decreasing axially in the direction of the end of the crystal is selected. This is because the nitrogen concentration always increases toward the end of the crystal because of the low segregation coefficient. Thus the susceptibility to precipitation which is reinforced by the increase in nitrogen is counteracted by the decreasing oxygen concentration. However, below an oxygen concentration of $4.15 \times 10^{17}$ atoms/$cm^3$, and even at higher nitrogen concentrations, there was no longer any oxygen precipitation observed. Significantly, it was found that above this oxygen concentration the getter action comes into play as early as the first steps in the component fabrication. This is true, in particular, for nitrogen-doped epitaxial substrates as well.

Further, in wafers prepared from the crystals pulled according to the invention, a denuded zone in excess of 10 $\mu$m was measured both after a heat treatment of 3 hours at 780° C., 10 hours at 1000° C. and also after a 4M DRAM process simulation. The depth increases with decreasing oxygen content and can thus be tailored to specific requirements.

Thus, by virtue of the pulling conditions according to the invention, not only is a substantially improved GOI quality obtained in the component production process, but the aforementioned disadvantages of nitrogen doping are also avoided. Methods for controlling the incorporation of oxygen when pulling Cz crystals are, for example, known from EP 0527,477 B1. Processes for doping Cz single crystals with nitrogen are, for example, known from JP-06,271,399 A.

The present invention also relates to a process for producing a silicon single crystal from a silicon melt comprising, pulling the silicon single crystal at a rate V; doping the silicon single crystal with nitrogen; setting up an axial temperature gradient G(r) at an interface between the silicon single crystal and the melt; and wherein a ratio V/G(r) in a radial direction is at least partially less than $1.3*10^{-3} cm^2 min^{-1} K^{-1}$.

Investigations with Cz single crystals, in whose production the ratio V/G(r) satisfied these conditions and which therefore should either in full or partially have Si interstitial defects, have surprisingly shown that these defects can be very greatly reduced. Also, these defects can be even fully suppressed, by the nitrogen doping although the effect on the vacancy defect density remains comparatively small. This means, in contrast to accepted knowledge of the simultaneous suppression of vacancy and Si interstitial defects, the nitrogen in the presence of oxygen acts selectively on the Si interstitial defects. The suppression of Si interstitial defects is important not only for polished Si wafers but also for epitaxial substrates. This is because unlike vacancy defects, Si interstitial defects grow into the epi-layer and likewise lead to defects there.

The nitrogen doping then makes it possible to reduce the rate when pulling the single crystal to the extent that vacancy defects no longer occur at all. In addition, vacancy defects may occur only in an inner region with a comparatively small diameter, without having to run the risk of creating detrimental Si interstitial defects in the outer region of the semiconductor wafer. The process therefore makes it possible to pull Cz single crystals and FZ single crystals which contain neither vacancy nor interstitial defects. Preferably, for this purpose, a furnace structure is chosen in which V/G(r) varies only to a small extent with r, r being the radial distance from the center of the crystal.

If the pulling conditions are selected so that V/G(r)<$c_{crit}$ is satisfied over the entire crystal diameter, then the OSF formation will be suppressed at the same time. Investigations have further shown that the mechanical strength of the crystals is significantly improved by the nitrogen doping if the single crystal is pulled under pulling conditions for which the ratio V/G(r)<$c_{crit}$.

In the case of crystals pulled with V/G(r)<$c_{crit}$ as well, it is favorable if the oxygen content is chosen low enough for only nitrogen-induced oxygen precipitation then to take place.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a silicon single crystal comprising
   pulling a silicon single crystal using Czochralski method; and
   doping the silicon single crystal with oxygen at a concentration of from at least $4.15*10^{17}$ atoms $cm^{-3}$ to less than $6.5*10^{17}$ atoms $cm^{-3}$ and doping the silicon single crystal with nitrogen at a concentration of more than $5*10^{13}$ atoms $cm^{-3}$ while pulling the silicon single crystal.

2. The process as claimed in claim 1, further comprising cooling the silicon single crystal by a heat shield surrounding said crystal during the pulling.

3. The process as claimed in claim 1, comprising
   selecting the oxygen doping to be low enough for formation of oxygen precipitates to occur only because of the nitrogen doping.

4. The process as claimed in claim 1, comprising adjusting a depth of a denuded zone by variation of the oxygen concentration.

5. The process as claimed in claim 4, comprising selecting the oxygen concentration to be low enough for no OSF formation to take place.

6. The process as claimed in claim 1, comprising adjusting a depth of a denuded zone by variation of the nitrogen concentration.

7. The process as claimed in claim 1, comprising pulling the silicon single crystal in such a way that said crystal contains neither vacancy defects nor interstitial defects.

8. The process as claimed in claim 1, comprising pulling the silicon single crystal as rapidly as possible; and actively cooling said silicon single crystal.

9. The process as claimed in claim 1, comprising pulling the silicon single crystal in such a way that the oxygen concentration decreases in an axial direction toward a crystal end, while the nitrogen concentration increases in said axial direction toward said crystal end.

10. A process for producing a silicon single crystal from a silicon melt comprising, pulling the silicon single crystal at a rate V;

doping the silicon single crystal with nitrogen;

setting up an axial temperature gradient G(r) at an interface between the silicon single crystal and the melt; and wherein a ratio V/G(r) in a radial direction is at least partially less than $1.3*10^{-3} cm^2 min^{-1} K^{-1}$.

11. The process as claimed in claim 10, comprising pulling the silicon single crystal using Czochralski method.

12. The process as claimed in claim 10, comprising producing the silicon single crystal using float zone method.

13. The process as claimed in claim 10, further comprising cooling the silicon single crystal by a heat shield surrounding said crystal during the pulling.

14. The process as claimed in claim 10, comprising doping the silicon single crystal with oxygen; and selecting the oxygen doping to be low enough for formation of oxygen precipitates to occur only because of the nitrogen doping.

15. The process as claimed in claim 14, comprising adjusting a depth of a denuded zone by variation of oxygen concentration.

16. The process as claimed in claim 15, comprising selecting the oxygen concentration to be low enough for no OSF formation to take place.

17. The process as claimed in claim 10, comprising adjusting a depth of a denuded zone by variation of the nitrogen concentration.

18. The process as claimed in claim 10, comprising pulling the silicon single crystal in such a way that said crystal contains neither vacancy defects nor interstitial defects.

19. The process as claimed in claim 10, comprising pulling the silicon single crystal as rapidly as possible; and actively cooling said silicon single crystal.

20. The process as claimed in claim 10, comprising pulling the silicon single crystal in such a way that an oxygen concentration is at least $4.15 \times 10^{17}$ atoms/cm$^3$.

21. The process as claimed in claim 10, comprising pulling the silicon single crystal in such a way that an oxygen concentration decreases in an axial direction toward a crystal end, while a nitrogen concentration increases in said axial direction toward said crystal end.

22. The process as claimed in claim 10, comprising dividing the silicon single crystal into nitrogen-doped semiconductor wafers; and using these wafers as epi-substrates.

23. The process as claimed in claim 10, comprising dividing the silicon single crystal into nitrogen-doped semiconductor wafers; and additionally heat treating said wafers by a rapid thermal anneal step of at least 1150° C.

24. The process as claimed in claim 10, comprising pulling the silicon single crystal with a V/G(r) ratio varying only slightly with respect to r, r being a radial distance from a center of the crystal.

25. A process for producing a silicon single crystal comprising pulling a silicon single crystal using Czochralski method;

doping the silicon single crystal with oxygen at a concentration of less than $6.5*10^{17}$ atoms cm$^{-3}$ and doping the silicon single crystal with nitrogen at a concentration of more than $5*10^{13}$ atoms cm$^{-3}$ while pulling the silicon single crystal; and dividing the silicon single crystal into nitrogen-doped semiconductor wafers; and using these wafers as epi-substrates.

26. A process for producing a silicon single crystal comprising pulling a silicon single crystal using Czochralski method;

doping the silicon single crystal with oxygen at a concentration of less than $6.5*10^{17}$ atoms cm$^{-3}$ and doping the silicon single crystal with nitrogen at a concentration of more than $5*10^{13}$ atoms cm$^{-3}$ while Pulling the silicon single crystal; and pulling the silicon single crystal with a V/G(r) ratio varying only slightly with respect to r, r being a radial distance from a center of the crystal.

* * * * *

UNITED STATES PATENT AND TRADEMARK OFFICE
CERTIFICATE OF CORRECTION

PATENT NO. : 6,228,164 B1 Page 1 of 1
DATED : May 8, 2001
INVENTOR(S) : Von Ammon et al.

It is certified that error appears in the above-identified patent and that said Letters Patent is hereby corrected as shown below:

<u>Title page,</u>
Line 2, of the heading, change "Ammon et al" to correctly read:
-- Von Ammon et al --.

Signed and Sealed this

Eighth Day of January, 2002

Attest:

Attesting Officer

JAMES E. ROGAN
*Director of the United States Patent and Trademark Office*